United States Patent
Lu et al.

(10) Patent No.: US 7,301,818 B2
(45) Date of Patent: Nov. 27, 2007

(54) HOLE ANNEALING METHODS OF NON-VOLATILE MEMORY CELLS

(75) Inventors: Wenpin Lu, Hsinchu (TW); Shaw Hung Ku, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 257 days.

(21) Appl. No.: 11/224,597

(22) Filed: Sep. 12, 2005

(65) Prior Publication Data
US 2007/0058440 A1    Mar. 15, 2007

(51) Int. Cl.
*G11C 11/34* (2006.01)

(52) U.S. Cl. .............................. 365/185.24; 365/185.29

(58) Field of Classification Search ........... 365/185.15, 365/185.22, 185.24, 185.28, 185.3, 185.29, 365/185.33
See application file for complete search history.

(56) References Cited

U.S. PATENT DOCUMENTS

| | | | |
|---|---|---|---|
| 6,240,019 B1 * | 5/2001 | Shiga et al. ............ | 365/185.22 |
| 6,434,054 B1 * | 8/2002 | Shiga et al. ............ | 365/185.29 |
| 6,614,694 B1 * | 9/2003 | Yeh et al. ............... | 365/185.29 |
| 2007/0025167 A1 * | 2/2007 | Ziegelmayer et al. ...... | 365/201 |
| 2007/0103980 A1 * | 5/2007 | Koebernick et al. ... | 365/185.09 |

OTHER PUBLICATIONS

C. Chen et al. "A New Source-Side Erase Algorithm to Reduce Wordline Disturb Problem in Flash EPROM" VLSI Technology, Systems and Applications, 1995, Proceedings of Technical Papers., 1995 International Symposium May 31 Jun. 2, 1995, pp. 321-325.
C.C. Yeh et al. "Novel Operation Schemes to Improve Device Reliability in a Localized Trapping Storage SONOS-type Flash Memory" IEEE 2003, pp. 173-176.

\* cited by examiner

*Primary Examiner*—Son Dinh
*Assistant Examiner*—Alexander Sofocleous
(74) *Attorney, Agent, or Firm*—Haynes Beffel & Wolfeld LLP

(57) ABSTRACT

Hole annealing methods are described after erasure of nitride storage memory cells for compensating trapped holes to minimize the holes from detrapping in order to reduce the amount of threshold voltage from drifting significantly higher. A soft hot electron program is used to selected nitride storage memory cells that have been detected to have a threshold voltage that is higher than a presetting threshold voltage (EV) minus a wordline delta X. The effect of the soft electron program neutralizes the excess holes introduced by erasure of nitride storage memory cells that decreases the amount of threshold voltage from drifting higher. In one embodiment, a hole annealing method describes a soft hot electron programming to nitride storage memory cells in a block of nitride memory array that have been determined to have a threshold voltage higher than the presetting threshold voltage minus the wordline delta X.

15 Claims, 13 Drawing Sheets

1200

HOLE ANNEALING METHODS OF NON-VOLATILE MEMORY CELLS

BACKGROUND OF THE INVENTION

1. Field of the Invention

The present invention relates generally to non-volatile memory integrated circuits, and in particular to hole annealing of nitride storage memory cells that affect the threshold voltage of erased nitride storage memory cells.

2. Description of Related Art

Electrically programmable and erasable non-volatile memory technologies based on charge storage structures known as Electrically Erasable Programmable Read-Only Memory (EEPROM) and flash memory are used in a variety of modern applications. A flash memory is designed with an array of memory cells that can be independently programmed and read. Sense amplifiers in a flash memory are used to determine the data value or values stored in a non-volatile memory. In a typical sensing scheme, an electrical current through the memory cell being sensed is compared to a reference current by a current sense amplifier.

A number of memory cell structures are used for EEPROM and flash memory. As the dimensions of integrated circuits shrink, greater interest is arising for memory cell structures based on charge trapping dielectric layers, because of the scalability and simplicity of the manufacturing processes. Memory cell structures based on charge trapping dielectric layers include structures known by the industry names Nitride Read-Only Memory (NROM), SONOS, and PHINES, for example. These memory cell structures store data by trapping charge in a charge trapping dielectric layer, such as silicon nitride. As negative charge is trapped, the threshold voltage of the memory cell increases. The threshold voltage of the memory cell is reduced by removing negative charge from the charge trapping layer.

NROM devices use a relatively thick bottom oxide, e.g. greater than 3 nanometers, and typically about 5 to 9 nanometers, to prevent charge loss. Instead of direct tunneling, band-to-band tunneling induced hot hole injection BTBTHH can be used to erase the cell. However, the hot hole injection causes oxide damage, leading to charge loss in the high threshold cell and charge gain in the low threshold cell. Moreover, the erase time must be increased gradually during program and erase cycling due to the hard-to-erase accumulation of charge in the charge trapping structure. This accumulation of charge occurs because the hole injection point and electron injection point do not coincide with each other, and some electrons remain after the erase pulse. In addition, during the sector erase of an NROM flash memory device, the erase speed for each cell is different because of process variations (such as channel length variation). This difference in erase speed results in a large Vt distribution of the erase state, where some of the cells become hard to erase and some of them are over-erased. Thus the target threshold Vt window is closed after many program and erase cycles and poor endurance is observed. This phenomenon will become more serious when the technology keeps scaling down.

A typical flash memory cell structure positions a tunnel oxide layer between a conducting polysilicon tunnel oxide layer and a crystalline silicon semiconductor substrate. The substrate refers to a source region and a drain region separated by an underlying channel region. A flash memory read can be executed by a drain sensing or a source sensing. For source side sensing, one or more source lines are coupled to source regions of memory cells for reading current from a particular memory cell in a memory array.

A traditional floating gate device stores 1 bit of charge in a conductive floating gate. The advent of NROM cells in which each NROM cell provides 2 bits of flash cells that store charge in an Oxide-Nitride-Oxide (ONO) dielectric. In a typical structure of a NROM memory cell, a nitride layer is used as a trapping material located between a top oxide layer and a bottom oxide layer. The ONO layer structure effectively replaces the gate dielectric in a floating gate device.

A nitride storage memory cell such as an NROM cell has increasingly become more promising, especially a nitride memory cell with channel hot electron program and junction edge band-to-band hot hole erasure that combines with a reverse read. The nitride storage memory cell is able to provide two physical bits per cell, which enhances the overall memory capacity. After several program and erase cycles, however, the threshold voltage Vt after erase tends to draft undesirably higher after a period of waiting time. The drifting of the threshold voltage Vt may lead to a reduction in the margin of logical read 1 or erase bits.

Therefore, there is a need for a hole annealing method that monitors and adjusts the threshold voltage Vt after erase to reduce the amount of drifting in the threshold voltage.

SUMMARY OF THE INVENTION

The present invention describes hole annealing methods after erase of nitride storage memory cells for compensating trapped holes to minimize the holes from detrapping in order to reduce the amount of threshold voltage from drifting significantly higher. A soft hot electron program is used to selected nitride storage memory cells that have been detected to have a threshold voltage that is higher than a presetting threshold voltage (EV) minus a wordline delta X. The effect of the soft electron program neutralizes the excess holes introduced by erasure of nitride storage memory cells which in turn decreases the amount of threshold voltage from drifting higher.

In a first embodiment, a hole annealing method describes a soft hot electron programming to nitride storage memory cells in a block of nitride memory array that have been determined to have a threshold voltage higher than the presetting threshold voltage minus the wordline delta X. The amount of time required for hole annealing method in this embodiment is significantly less than a conventional method. In a second embodiment, an additional safeguard step is added in the hole annealing method for checking nitride storage memory cells in the block of the nitride memory array that have been over-annealed during the soft hot electron programming. The voltage level which is determined to be over-annealed is set at, for example, the presetting threshold voltage plus a second wordline delta Y. Nitride storage memory cells in the block of the nitride memory array that have been determined to over-anneal are erased again to a threshold voltage level less than the presetting threshold voltage plus the second wordline delta Y. In a third embodiment, nitride storage memory cells that have been erased again to a voltage threshold level less than the presetting threshold voltage plus the second wordline delta Y is re-checked again to determine if the threshold voltage level of the erased again nitride storage memory cells falls between the presetting threshold voltage, and presetting threshold voltage minus the first wordline delta X.

Broadly stated, a method for hole annealing a non-volatile memory array in which each non-volatile memory cell has a nonconducting charge-trapping material placed between a first insulating material and a second insulating material, comprises recording as a failed non-volatile memory cell for a non-volatile memory cell in one or more non-volatile memory cells that has a threshold voltage higher than an erase verification level minus a first wordline delta; annealing softly using weak electron hot electron program in the one or more non-volatile memory bits that have been detected as failed memory bits by injecting electrons to compensate for trapped holes in a first insulating material; and checking for over-annealing of the failed non-volatile memory cells such that the threshold voltage in the non-volatile memory cell is higher than a predetermined over-annealing voltage level.

Advantageously, the present invention can be implemented for merging with existing erase procedures with a reasonable time frame. The present invention also advantageously reduces the amount of hole annealing duration. The present invention further advantageously avoid the necessity of requiring a very high bias voltage.

The structures and methods regarding to the present invention are disclosed in the detailed description below. This summary does not purport to define the invention. The invention is defined by the claims. These and other embodiments, features, aspects, and advantages of the invention will become better understood with regard to the following description, appended claims and accompanying drawings.

DETAILED DESCRIPTION OF EMBODIMENTS OF THE INVENTION

Figure 1:
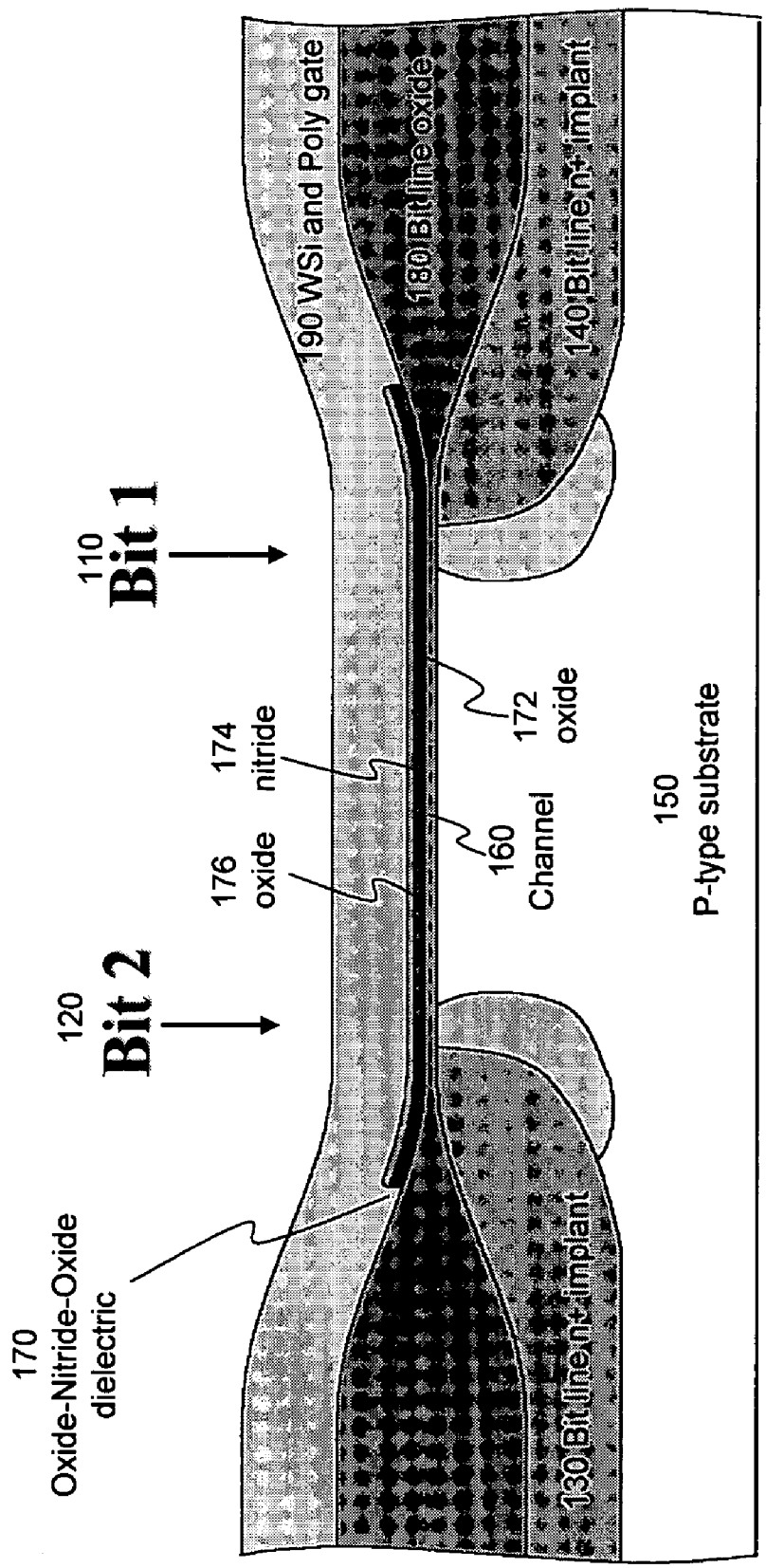
FIG. 1 a structural diagram illustrating a cross-section of a nitride storage cell structure that provides two bits of memory storage in accordance with the present invention.

Referring now to FIG. 1, there is shown a structural diagram illustrating a cross-section of a nitride storage cell structure 100 having a first bit 110 and a second bit 120. The nitride storage cell structure 100 is manufactured with the bit line n+ implant 130 and a bit line n+ implant 140 on a p-type substrate 150. A channel 160 extends from a right edge of the bit line n+ implant 130 to the left edge of the bit line n+ implant 140. An oxide-nitride-oxide dielectric 170 has a bottom silicon dioxide layer 172, which is overlaid by a silicon nitride layer 174, which is overlaid by an upper silicon dioxide layer 176. A tungsten silicide (WSi2) and poly gate 190 overlays the top silicon dioxide layer 176. A bit line oxide 180 is disposed between the bit line n+ implant 140 and the WSi and poly gate 190.

Figure 2:
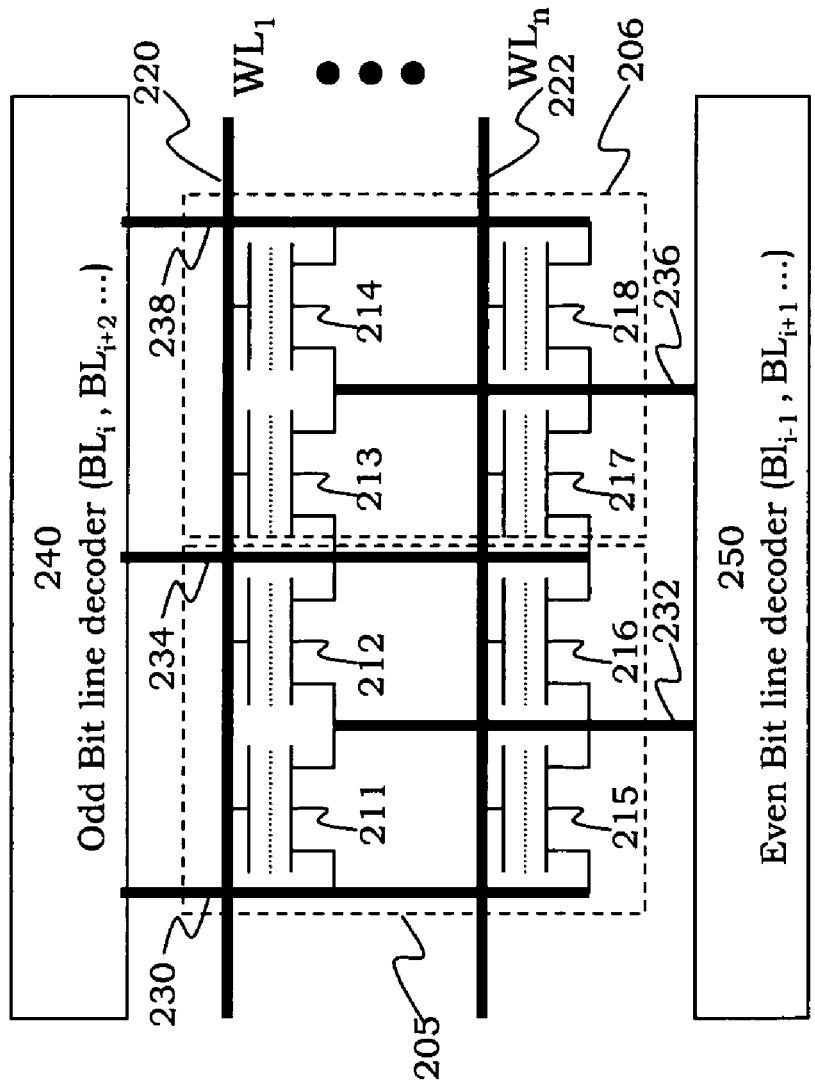
FIG. 2 is a simplified circuit diagram illustrating a nitride memory array having multiple nitride memory cells coupled to an odd bit line decoder and an even bit line decoder in accordance with the present invention.

In FIG. 2, there is shown a simplified circuit diagram illustrating a nitride memory array 200 having a first nitride memory cell 211, a second nitride memory cell 212, a third nitride memory cell 213, a fourth nitride memory cell 214, a fifth nitride memory cell 215, a sixth nitride memory cell 216, a seventh nitride memory cell 217, and an eighth nitride memory cell 218. In this illustration, the nitride memory array 200 is divided into a first block 205 and a second block 206, where the first block 205 comprises the first nitride memory cell 211, the second nitride memory cell 212, the fifth nitride memory cell 215, and the sixth nitride memory cell 216, while the second block 206 comprises the third nitride memory cell 213, the fourth nitride memory cell 214, the seventh nitride memory cell 217, and the eighth nitride memory cell 218. A first wordline 220 is connected to a respective gate voltage in the first nitride memory cell 211, the second nitride memory cell 212, the third nitride memory cell 213, and the fourth nitride memory cell 214. A second wordline 222 is connected to a respective gate voltage in the a fifth nitride memory cell 215, the sixth nitride memory cell 216, the seventh nitride memory cell 217, and the eighth nitride memory cell 218. A first metal bit line 230 is extended and connected to the left region of the first nitride storage cell 211 and the left region of the fifth nitride storage cell 215. A second metal bit line 232 is extended and connected to the right region of the first nitride storage cell 211 and the right region of the fifth nitride storage cell 215, and the left region of the second nitride storage cell 212 and left region of the sixth nitride storage cell 216. A third metal bit line 234 is extended and connected to the right region of the second nitride storage cell 212 and the right region of the sixth nitride storage cell 216, and the left region of the third nitride storage cell 213 and the left region of the seventh nitride storage cell 217. A fourth metal bit line 236 is extended and connected to the right region of the third nitride storage cell 213 and the right region of the seventh nitride storage cell 217, and the left region of the fourth nitride storage ell 214 and the left region of the eighth nitride storage cell 218. A fifth metal bit line 238 is extended and connected to the right region of the fourth nitride storage cell 214 and the right region of the eighth nitride storage cell 218. Each of the left region can be a source region or a drain region depending on which side a virtual ground is placed. Each of the right region can also be a source region or a drain region depending on which side the virtual ground is placed.

An odd bit line decoder ($BL_i$, $BL_{i+2}$, . . . ) 240 couples to the first metal bit line 230, the second metal bit line 234 and the fifth metal bit line 238. An even bit line decoder 250 ($BL_{i-1}$, $BL_{i+1}$, . . . ) couples to the second metal bit line 232 and the fourth metal bit line 236. The combination of the odd bit line decoder 240 and the even bit line decoder 250 enables access to a particular nitride storage cell through the selection of a metal bit line coupled to the odd bit line decoder 240 and a metal bit line coupled to the even bit decoder 250. For example, when a command requests a read operation of the nitride storage cell 211 on the first wordline 220, the odd bit line decoder 240 selects the first metal bit line 230 while the even bit line decoder 250 selects the second metal bit line 232.

Figure 3:
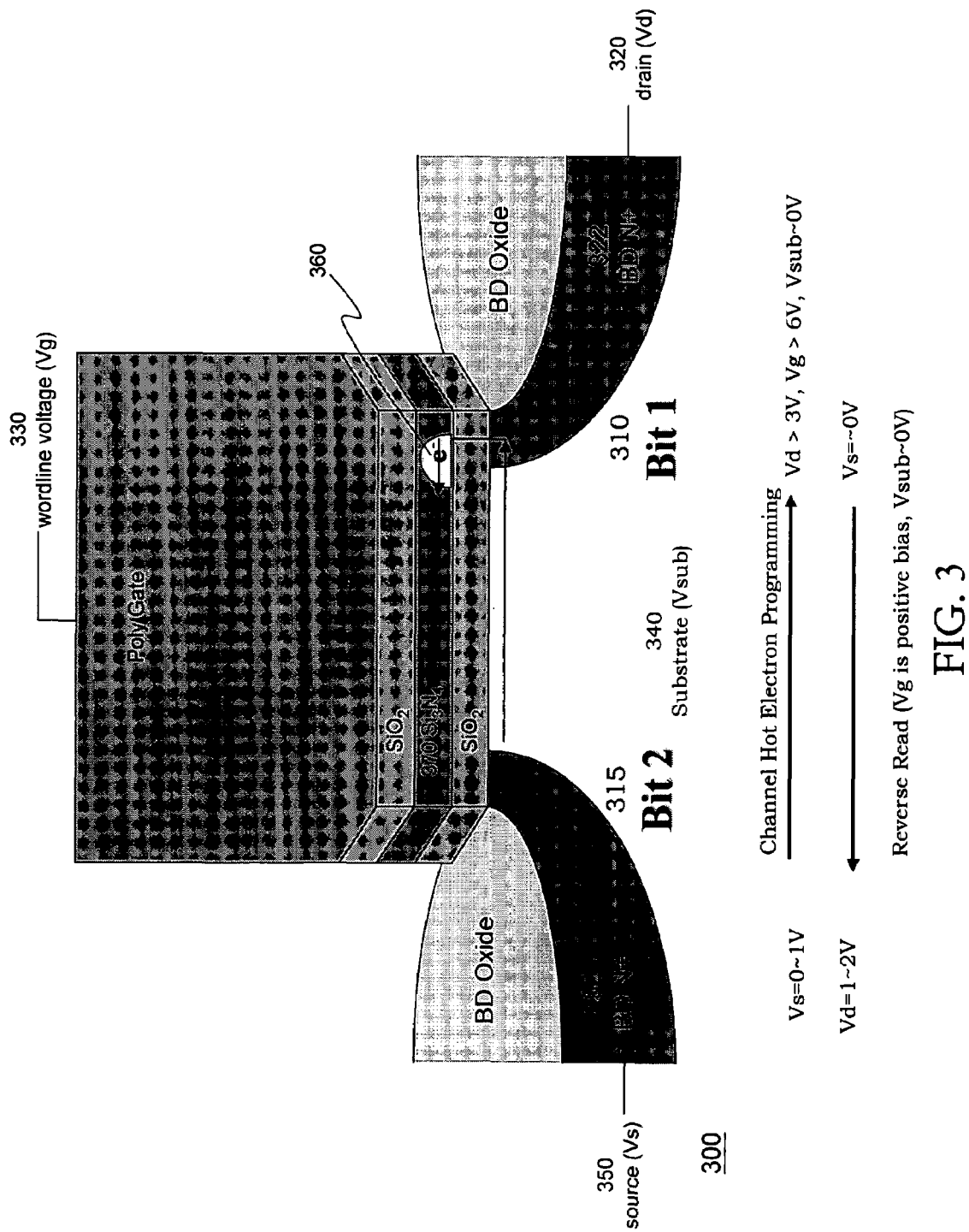
FIG. 3 is a simplified process diagram illustrating a cross-section of a nitride storage cell in program mode using channel hot electron programming in accordance with the present invention.

FIG. 3 is a simplified process diagram 300 illustrating a cross-section of a nitride storage cell in program mode using channel hot electron programming. When program bit 1 310, the drain region 320 is defined on the right side connected to the barrier diffusion N+ (BD N+) 322, and the source region 350 is defined on the left side connected to a barrier diffusion N+ 352. To program bit 1 310, the voltage Vd at the drain region 320 is set to a number larger than 3 volts, a gate voltage or the wordline bias Vg 330 is set to a voltage level larger than 6 volts, and a substrate voltage Vsub 340 is set approximately equal to zero or is connected to ground. On the other side, the barrier diffusion N+ 352 is connected to the source region 350 that functions as virtual ground Vs. The identification and operation of a drain region and a source region is interchangeable with the use of a virtual ground Vs such that the drain region is on the right side and the source region is on the left side when programming bit 1, and such that the drain region is on the left side and the source region is on the right side when programming bit 2. Electrons 360 are stored in a nitride layer ($Si_3N_4$) 370 during programming.

When program bit 2 315, the drain voltage Vd is now on the right side connected to the barrier diffusion N+ 322 while the source region is on the left side connected to the barrier diffusion N+ 352. To program bit 2 315, the drain voltage Vd is selected to be higher than 3 volts, the gate voltage or the wordline bias Vg is selected to be higher than 6 volts, and the substrate voltage Vs is set to approximately zero. The substrate voltage Vsub is set approximately equal to zero or is connected to ground.

Figure 4:
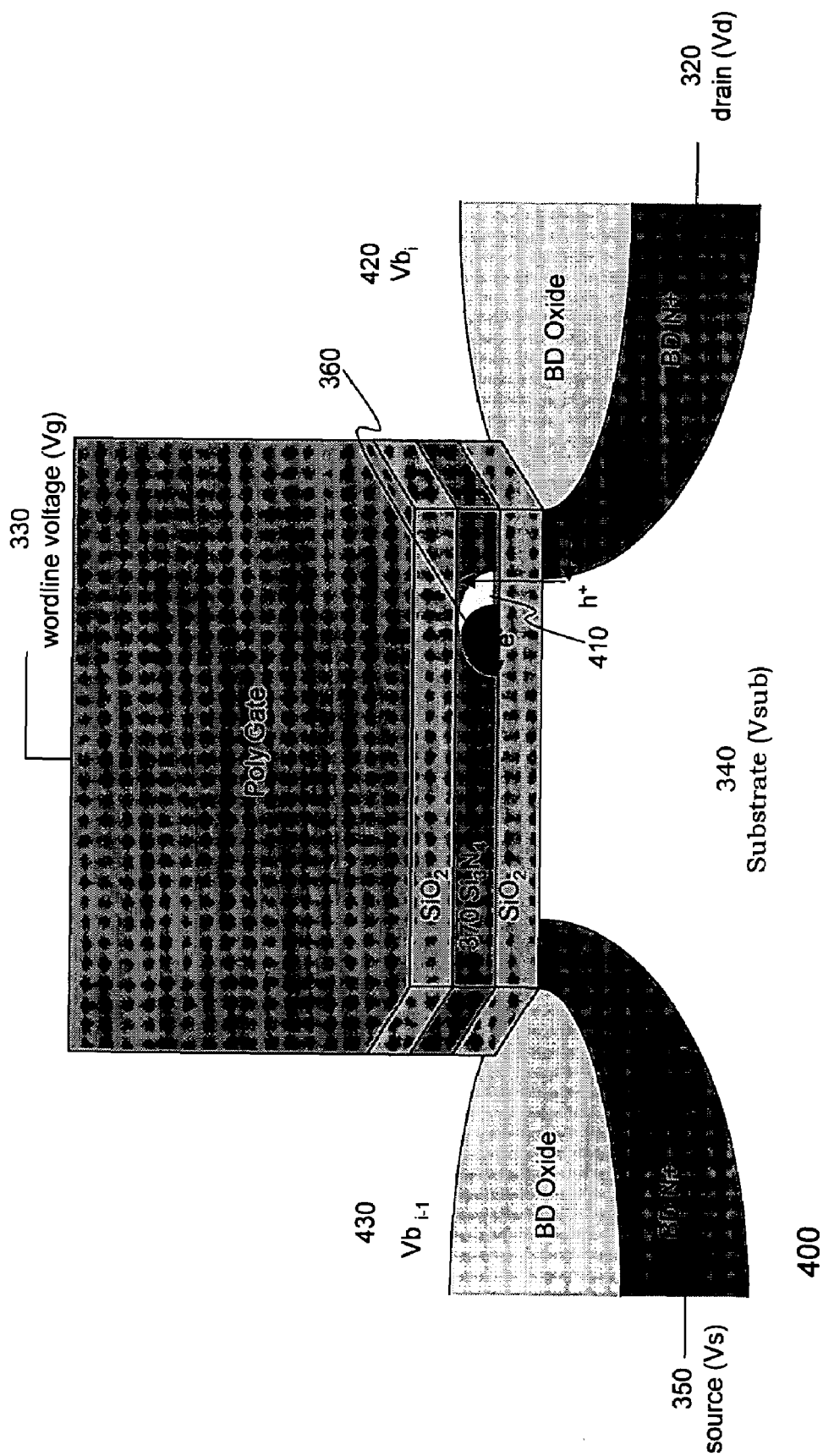
FIG. 4 is a simplified process diagram illustrating a cross-section of a nitride storage cell in erase mode using band-to-band tunneling induced hot hole injection in accordance with the present invention.

FIG. 4 is a simplified process diagram 400 illustrating a cross-section of a nitride storage cell 400 in erase mode using band-to-band tunneling induced hot hole injection. When erasing the nitride storage cell 400 using band-to-band tunneling induced hot hole injection, one or more holes 410 h+ enter the nitride layer 370, which will reduce the level of the threshold voltage. The wordline voltage Vg 330 is connected to a negative voltage. Each of the bit line voltages Vbi, Vbi+2, Vbi+4 for the even metal bit lines is connected to a positive voltage in the range of 3 to 10 volts. Each of the bit line voltages Vbi−1, Vbi+1, Vbi+3 for the odd metal bit lines is left floating or is connected to a voltage less than 2 volts. The substrate voltage Vsub 340 is connected to ground. The nitride storage cell 400 in FIG. 3 represents one nitride storage cell that has a bit line voltage Vbi 420 on the right side and a bit line voltage Vbi−1 430 on the left side. One of ordinary skill in the art should recognize that the bit line voltages Vbi, Vbi+2, Vbi+4 for the even metal bit lines and the metal bit line voltages Vbi−1, Vbi+1, Vbi+3 for the odd metal bit lines are applicable to a memory array of nitride storage cells, such as the memory array 200 shown in FIG. 2. The voltage settings for Vg, Vbi, Vbi−1, and Vsub are summarized below.

Figure 5:
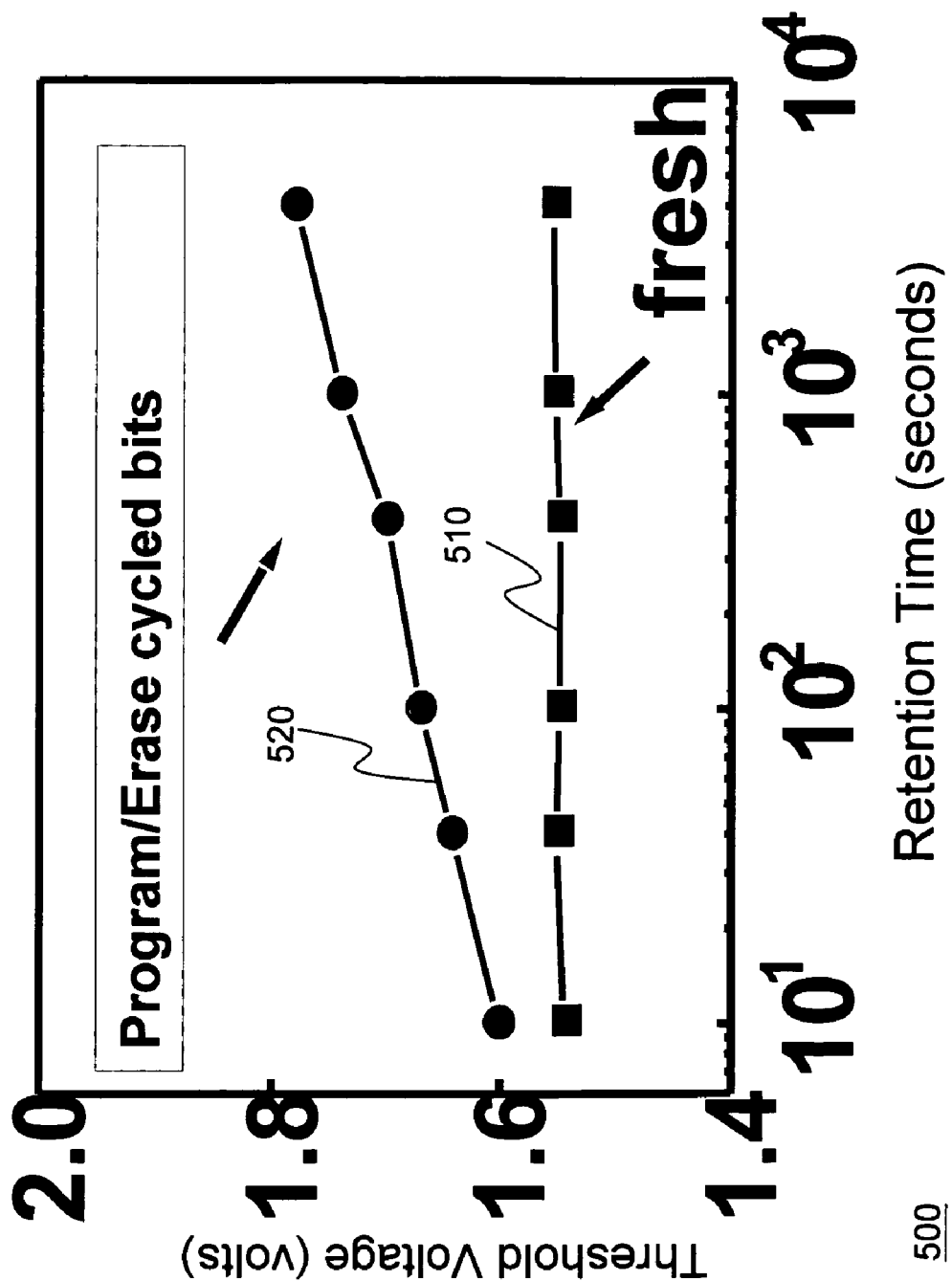
FIG. 5 is a graphical diagram illustrating two sampling curves for a plurality of memory bits comparing a set of fresh plurality of memory bits to a set of memory bits that have been programmed and erased for a period of time in accordance with the present invention

Vg=negative voltage
Vbi, Vbi+2, Vbi+4 . . . =positive voltage (3~10V)
Vsub=ground
Vbi−1, Vbi+1, Vbi+3 . . . =floating or ground or <2V A graphical diagram 500 in FIG. 5 illustrates two sampling curves for a plurality of memory bits comparing a set of fresh plurality of memory bits to a set of memory bits that have been programmed and erased for a period of time. The x-axis represents the retention time in seconds and the y-axis represents the threshold voltage in volts. A first curve 510 with square points show memory bits that are fresh, i.e. memory bits that have not been programmed and erased. The threshold voltage for the curve 510 remains unchanged over time. A second curve 520 with circle dots show that some memory bits have been cycled multiple times. The term "cycled" means that memory bits have been programmed and erased. A typical number of cycles range from one time to 10 k times of program and erase iterations. For the cycled memory bits, after a period of time, the threshold voltage Vt for the cycled memory bits tend to drift higher, as shown in the second curve 520 that starts at approximately 1.6 volts to 1.8 volts.

Figure 6:
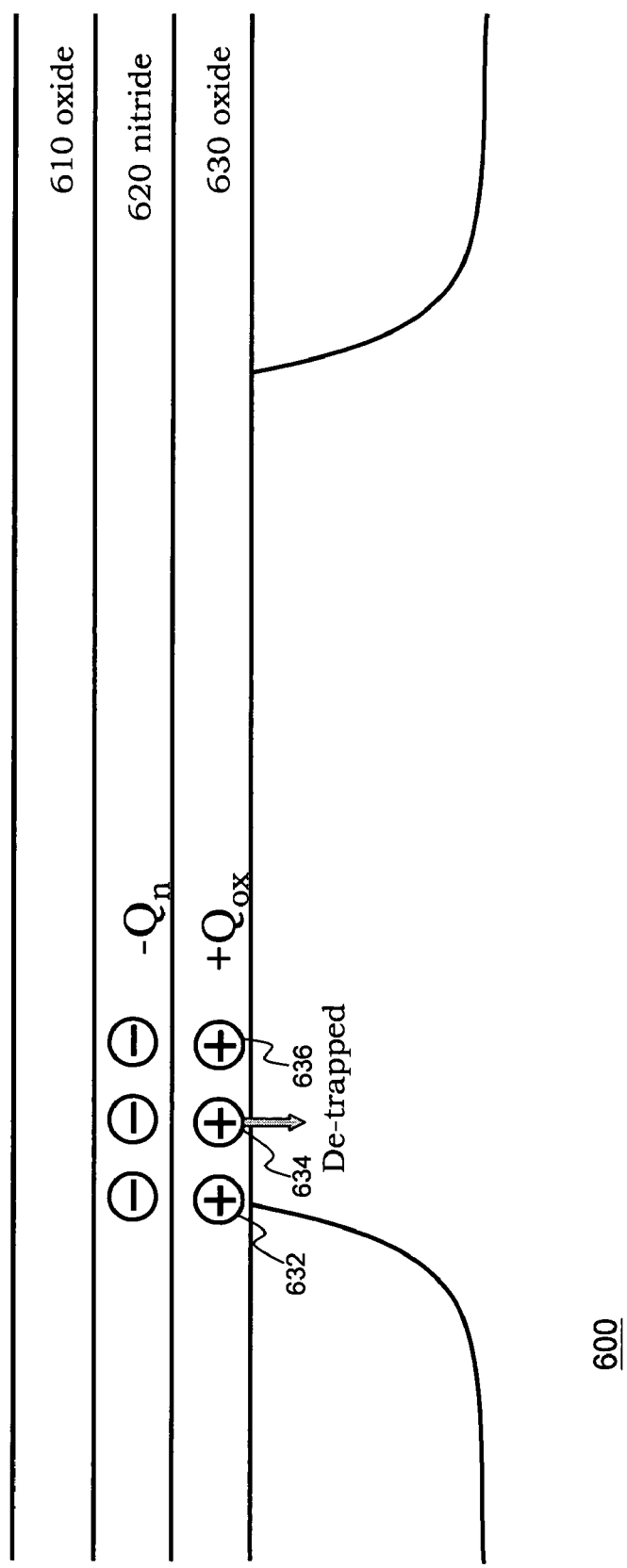
FIG. 6 is a simplified process diagram illustrating a memory cell structure with the charge distribution in an erase-state in accordance with the present invention.

Turning now to FIG. 6, there is shown a simplified process diagram illustrating a memory cell structure 600 with the charge distribution in an erase-state. The memory cell structure 600 comprises a top silicon dioxide layer 610, which overlays a silicon nitride layer 620, which overlays a bottom silicon dioxide layer 630. After several program and erase cycles, holes 632, 634, and 636 may be trapped in the bottom silicon dioxide layer 630 that are created during band-to-band-tunneling (BTBT) hot hole erasure. The symbol +Qox denotes the total number of holes trapped in the bottom silicon dioxide layer 630, or the equivalent of the positive charge in the bottom silicon dioxide layer 630. After a brief period of time, e.g. 100 ms, one or more holes in the holes 632, 634 and 636 may be detrapped from the bottom silicon dioxide layer 630. The symbol −Qn denotes the total number of electrons or the equivalent of the negative charge in the silicon nitride layer 620. When some of the holes (or the positive voltage) escape, the threshold voltage Vt likely to drift higher to an undesirable level over a period of time.

Figure 7:
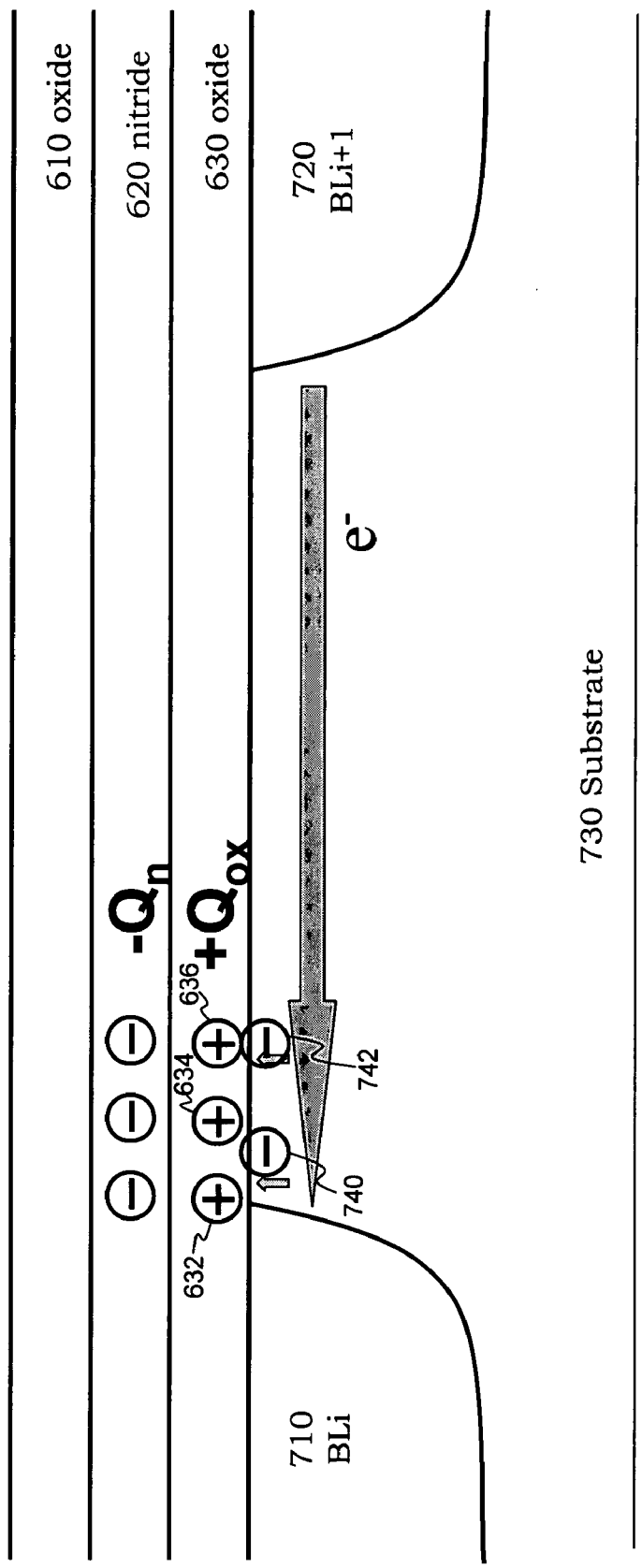
FIG. 7 is a simplified process diagram illustrating a memory cell structure with soft hole annealing using a weak hot electron program in accordance with the present invention.

As shown in FIG. 7, there is a simplified process diagram illustrating a memory cell structure 700 with soft hole annealing using a weak hot electron program. After the memory cell structure 700 has undergone an erase operation, a soft hole annealing using weak hot electron program is applied to the memory cell structure 700 for compensating the trapped holes 632, 634 and 636. The term "weak hot electron program" of "soft hot electron program" carries the meaning that the bias voltages, both the bit line bias voltage $V_{BLi}$, and the wordline bias voltage Vg, are less than a program bias voltage. When weak hot electron is used to anneal the holes 632, 634, and 636, the voltage applied enters the bottom silicon dioxide layer 630, thereby neutralizing some or all of the holes 632, 634, and 636. A portion of the applied voltage may also enter the silicon nitride layer 620. In this instance, the applied voltage is represented by electrons 740 and 742 that travel from a substrate 730, entering the bottom silicon dioxide layer 630 to neutralize the holes 632, 634, and 636. After some or all of the electrons neutralize some or all of the holes, the total number of holes in the bottom silicon dioxide layer 630 will be reduced, which in turn is reflected in the reduced value of +Qox. In one implementation, the bit line voltage, VBLi 710 is set in the range of 3 to 4 volts, the wordline voltage is set between 2 to 8 volts, the VBLi+1 720 is set between 0 to 1 volt, and the voltage Vsub at the substrate 730 is set to zero volt. For example, the bottom silicon dioxide layer 630 starts with having about 50 holes trapped within the bottom silicon dioxide layer 630. After a weak hot electron program applied to the memory cell structure 700, some or all of electrons from the substrate enter the bottom silicon dioxide layer 630, neutralizing about thirty holes, leaving about twenty holes trapped in the bottom silicon dioxide layer 630. With the total number of holes reduced from 50 to 20, the probability of the holes escaping the bottom silicon dioxide layer 630 is in turn also reduced. Although the threshold voltage Vt may still drift higher over time, the voltage drift likely will occur more slowly and at a lesser magnitude.

Figure 8:
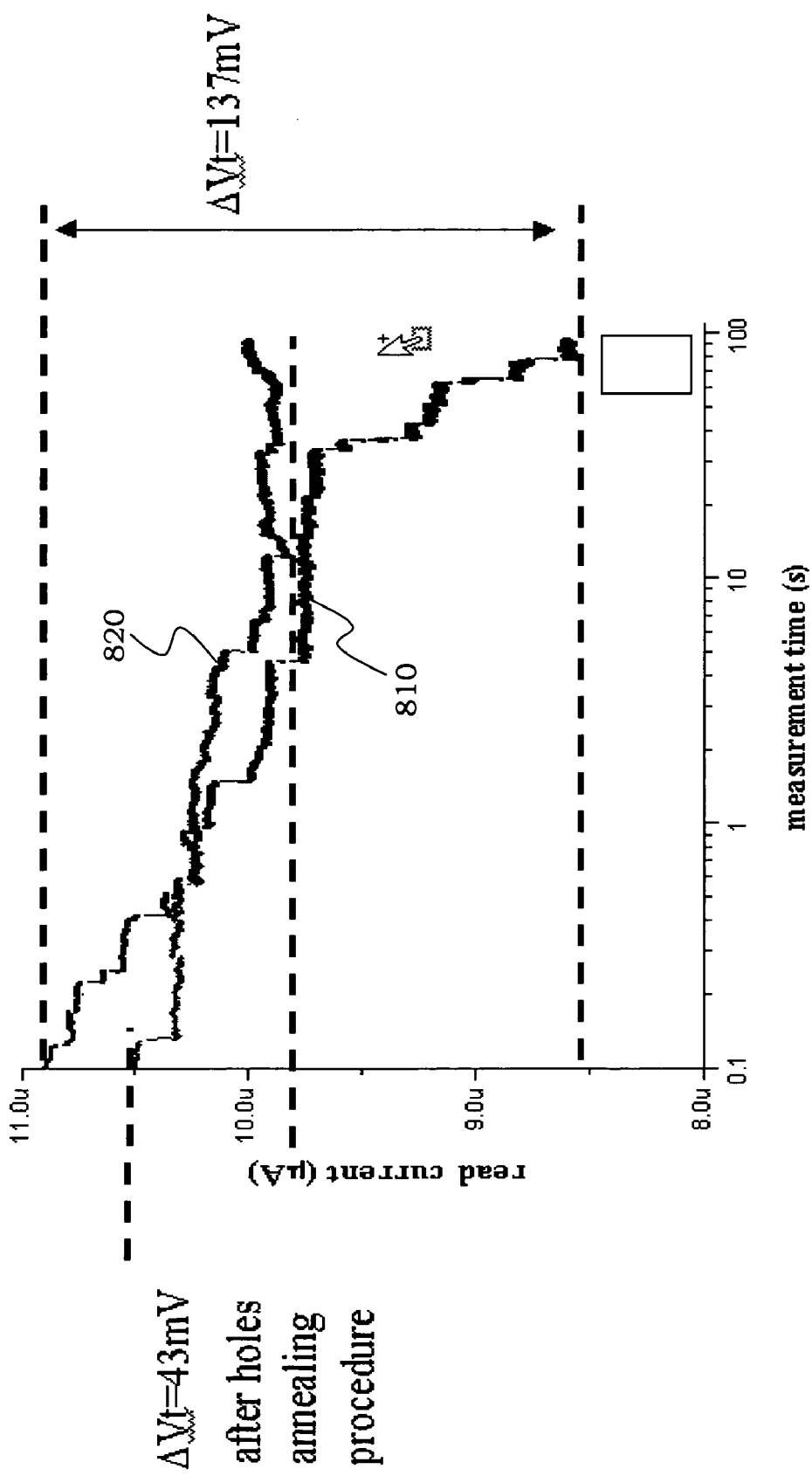
FIG. 8 is a graphical diagram illustrating two sampling curves comparing a typical threshold voltage after erase and a threshold voltage after erase which has been hot hole annealed in accordance with the present invention.

In FIG. 8, there is a graphical diagram illustrating two sampling curves comparing a typical threshold voltage after erase and a threshold voltage after erase which has been hot hole annealed. Sample curves 810 and 820 shown in FIG. 8 represent a memory cell read current, which function inverse to a threshold voltage. The first curve 810 represents sampling points of a threshold voltage after erase without hot hole annealing. The threshold voltage in the first curve 810 drifts higher to a voltage level as much as 137 mV after 100 seconds of waiting. As explained above, because the threshold voltage functions inverse proportional to the memory cell read current, the first curve 810 shows the voltage drop ΔVt in the amount of 137 mV, which means that the threshold voltage drift higher by 137 mV. The increased threshold voltage causes the read current to reduce from 11.0 μA to 8.6 μA, which is about 2.4 μA reduction in the read current. The second curve 820 represents sampling points of a threshold voltage after erase with hot hole annealing. The pace of drifting in the threshold voltage Vt with an added hot hole annealing is slower relative to the increase in the threshold voltage Vt without the added hot hole annealing. A weak hot electron program after erase is used to neutralize the trapped holes in the bottom silicon dioxide layer 630. As a result, the threshold voltage Vt after erase increases just 43 mV, which is equal to about 0.75 μA after 100 seconds of waiting at room temperature.

Figure 9:
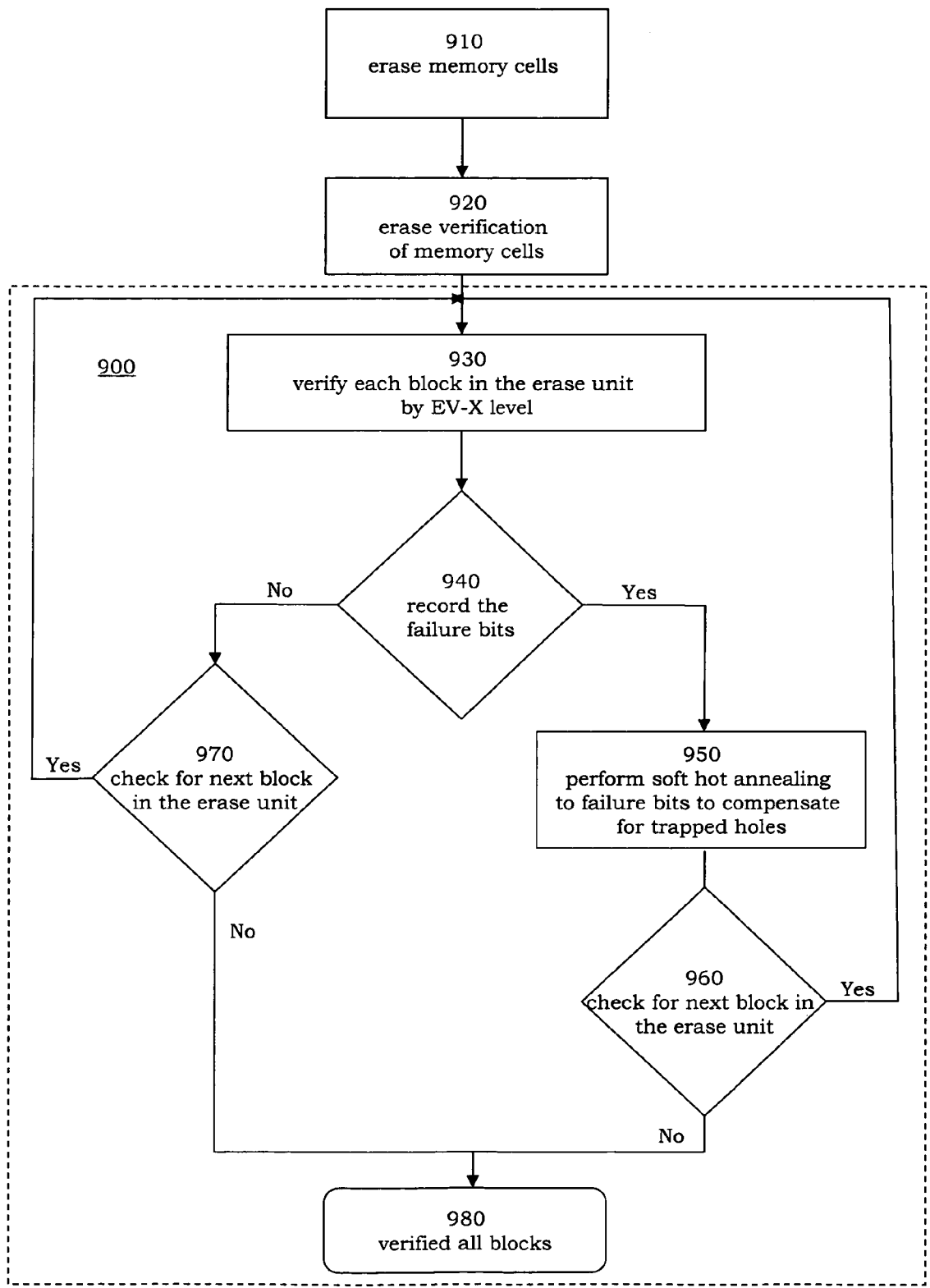
FIG. 9 is a flow diagram illustrating the first embodiment of the hole annealing process for alleviating that the threshold voltage Vt from drifting substantially higher after erasing nitride storage memory cells in accordance of the present invention.

In FIG. 9, there is shown a flow diagram illustrating the first embodiment of the hole annealing process 900 for alleviating the threshold voltage Vt from drifting substantially higher after erasing nitride storage memory cells. Prior to erasing, the voltage distribution of the nitride memory cells is approximately equal to the high threshold voltage Vt. At step 910, the memory cells undergo a complete erase using a junction edge hot hole erase operation or band-to-band tunneling erase, where the gate voltage Vg is set to a negative bias, the substrate voltage Vsub is set to approximately 0 volt, the odd (or even) bit lines are connected to a positive bias, and the even (or odd) lines are connected to some fixed bias, e.g. 0 to 2 volts, or keep the lines floating. At step 920, the erase verification is conducted to check the bits in the nitride memory cells have been erased by determining if each nitride memory bit has reached a presetting threshold voltage, EV. After all nitride memory bits in an erase unit in a memory array passes the erase verification, the weak hot hole annealing process 900 begins to compensate for excess holes that may have been introduced during the erase operation.

At step 930, the hole annealing process 900 checks a block in the erase unit to detect for nitride memory bits in which the threshold voltage of a particular nitride memory bit is higher than the wordline voltage, i.e. EV-X. Each erase unit comprises a multiple number of blocks or sections. For all nitride memory bits which have a threshold voltage higher than EV-X, the hole annealing process 900 records at step 940 these nitride memory bits as failure bits. At step 950, the hole annealing process 900 performs soft hot annealing by weak hot electron program to the failure nitride memory bits by introducing electrons 740 and 742 in the substrate 730 for neutralizing the trapped holes in the bottom silicon dioxide layer 630. The electrons 740 and 742 introduced by the weak hot electron program to compensate for the trapped holes abate the voltage threshold Vt of erased memory bits from drifting substantially higher. The hole annealing process 900 checks at step 960 whether if there are any additional blocks in the erase unit, and if so, the hole annealing process 900 proceeds to the next block in the erase unit and subsequently returning to the step 930 for conducting an erase verification of nitride memory bits in the next block of the erase unit. If all of the blocks in the erase unit have been verified, the hole annealing process 900 completes the hot annealing process at step 980. Similarly, from the other branch of the decision box 940, if there are no failure nitride memory bits detected, then the hole annealing process 900 check at step 970 whether if there are any additional blocks in the erase unit that have not been verified, and if there remain blocks in the erase unit, the hole annealing process hole annealing proceeds to the next block in the erase unit and subsequently returning to the step 930 for conducing an erase verification of the nitride memory bits in the next block of the erase unit. Otherwise, if all of the blocks in the erase unit have been verified at step 970, the hole annealing process 900 completes the hot annealing process at step 980.

Figure 10:
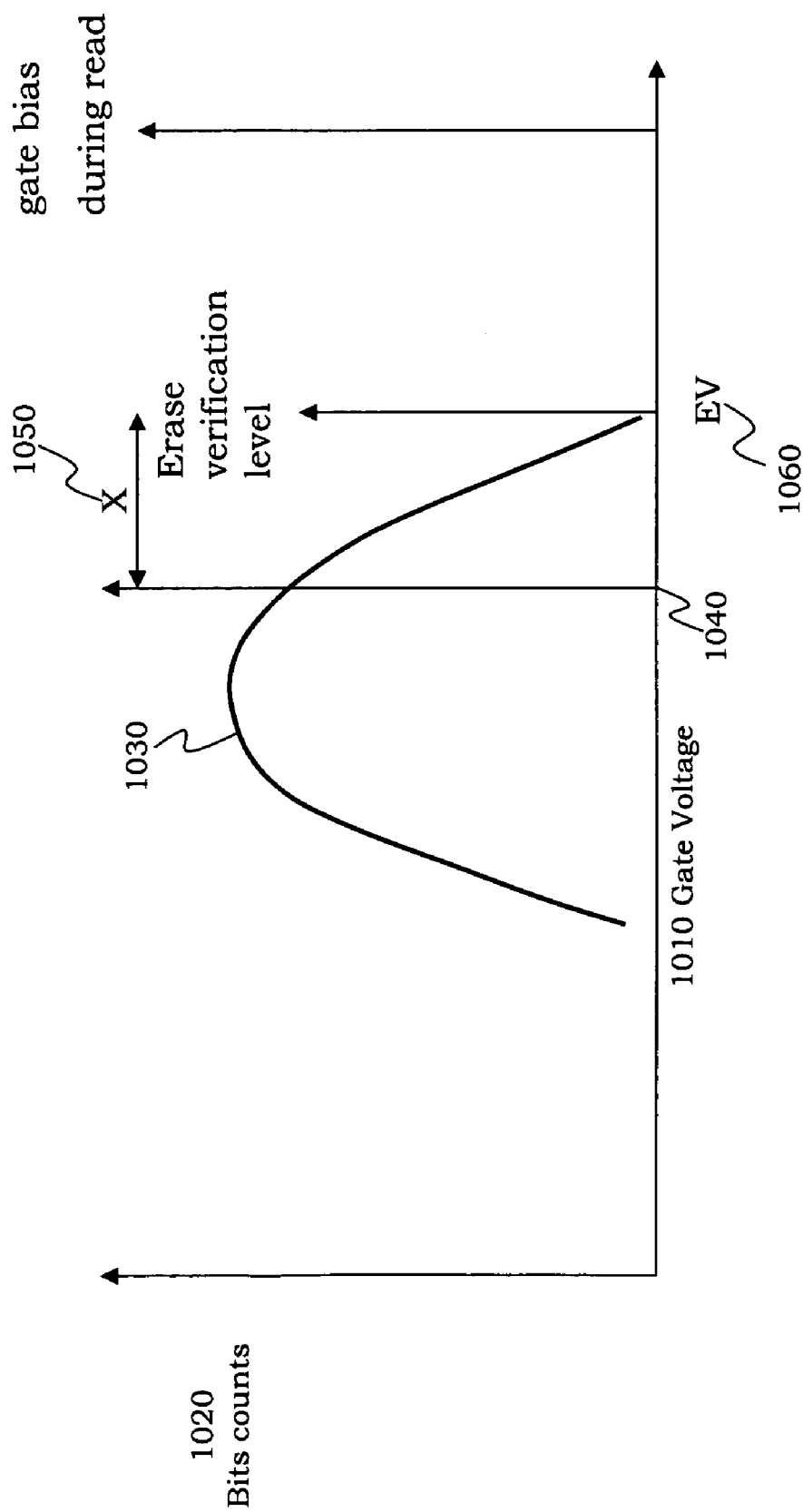
FIG. 10 is a graphical diagram illustrating the voltage distribution of memory bits after an erase operation with the wordline voltage serving as reference level in accordance of the present invention.

FIG. 10 is a graphical diagram 1000 illustrating the voltage distribution of memory bits after an erase operation with the wordline voltage serving as a reference level. The x-axis 1010 in the graph 1000 represents a gate voltage of a nitride memory bit, and the y-axis 1020 in the graph 1000 represents the number of nitride memory bits. A curve 1030 depicts the voltage distribution of a plurality of nitride memory bits. For example, a nitride memory block comprises 8 bits of nitride memory cells where the threshold voltage for the 8 bits may vary, thereby producing the threshold voltage distribution curve 1030. In the graph 1000, most of the nitride memory bits have threshold voltages that are less than a wordline voltage 1040. A symbol EV 1060 represents the erase verification level in which a memory bit must reach after erase has been performed to be considered a valid erase. The voltage level EV is preset at a level which is a sum of the wordline voltage plus a parameter X 1050, where the parameter X 1050 denotes a variable or delta from the wordline voltage in order to reach the erase verification level EV 1060. For example, the EV voltage 1060 could be set at 2.0 volts, the wordline voltage delta X 1050 set at 0.4 volt, and the wordline voltage would therefore be computed as 1.6 volts (2.0 volts minus 0.4 volt).

Figure 11:
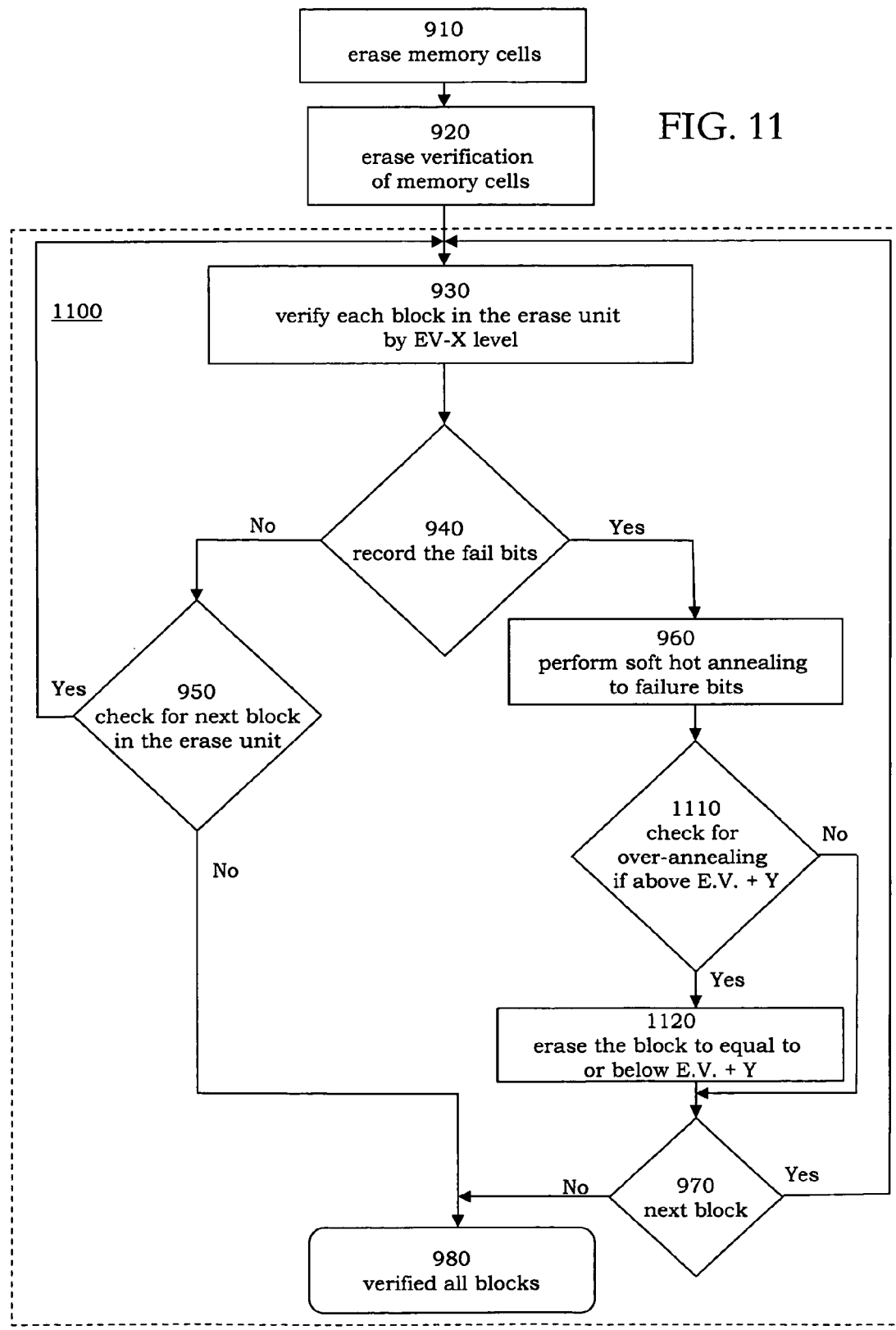
FIG. 11 is a flow diagram illustrating the second embodiment of the hole annealing process with an over-anneal check to alleviate the threshold voltage Vt from drifting substantially higher after erase of nitride storage memory cells in accordance of the present invention.

Referring now to FIG. 11, there is shown a flow diagram illustrating the second embodiment of the hole annealing process 1100 with an over-anneal check to alleviate the threshold voltage Vt from drifting substantially higher after erase of nitride storage memory cells. Although a weak hot electron program after erase compensates for trapped holes in the bottom silicon dioxide layer 630, a nitride memory bit may actually become over-anneal such that the threshold voltage of the nitride memory bit after soft hot annealing is too high. It is desirable to maintain a margin of the threshold voltage between a read operation voltage verses an erase verification level voltage. Additional steps to verify for hole over-annealing above a certain threshold, e.g. EV+Y are implemented. The symbol Y denotes another wordline voltage delta that represents the amount of voltage increase from the erase verification EV which would indicate an over-anneal of a nitride memory cell. For example, the wordline voltage delta is set between 0 to 5 volts. At step 1110, the process 1100 checks for over-anneal of nitride memory bits to a voltage level above an EV+Y level. If a block is determined to have been over-annealed, the block is erased back to below the EV+Y level before proceeding to step 970 for check for the next block in an erase unit. However, at step 1120, if the nitride memory block is determined that there is no over-annealing in any of the nitride memory bits, the process 1100 branches to step 970 to check for if there are additional blocks in the erase unit.

Figure 12:
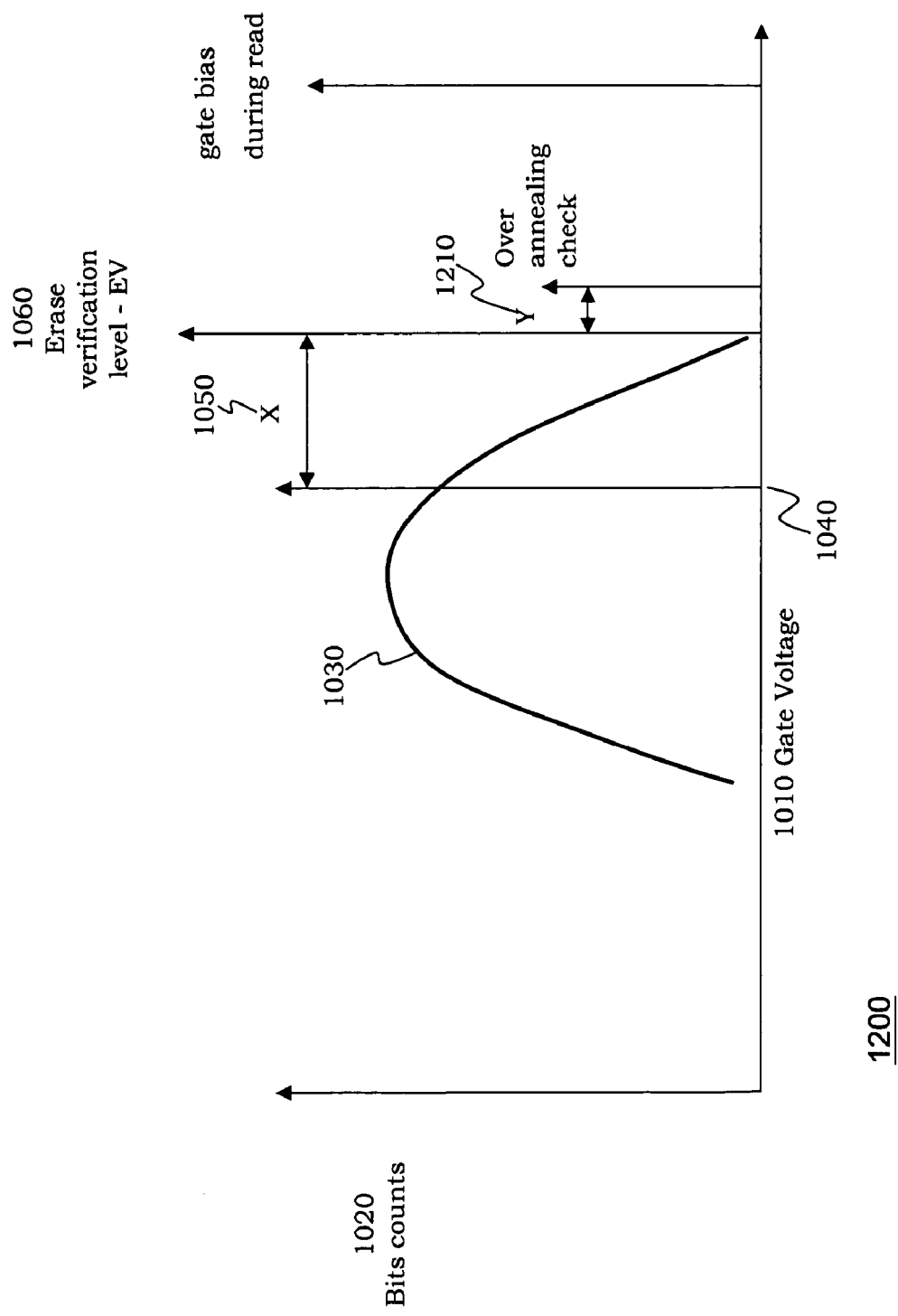
FIG. 12 is a graphical diagram illustrating the threshold voltage distribution of memory bits with respect to the second embodiment of the invention.

A graphical diagram 1200 in FIG. 12 shows the threshold voltage distribution of nitride memory bits with respect to the second embodiment of the invention. The wordline voltage delta Y 1210 is a variable that is above EV, where the voltage EV+Y represents a level in which a nitride memory bit has been over-annealed. If the process 1200 determines that the threshold voltage of a nitride memory block has been over-annealed, the nitride memory block is erased back to a voltage level that is below EV+Y.

Figure 13:
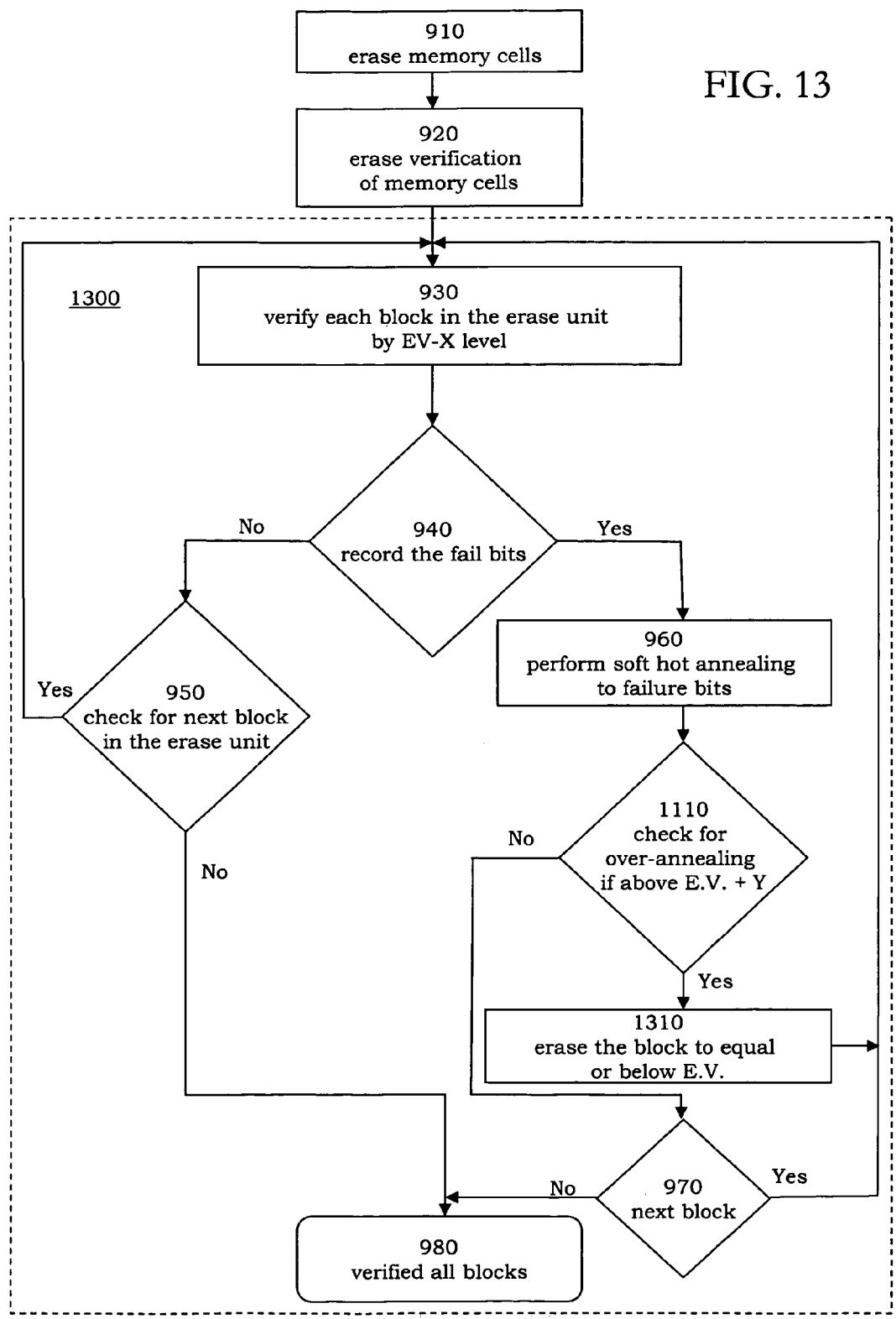
FIG. 13 is a flow diagram illustrating the third embodiment of the hole annealing process with an over-anneal check to alleviate the threshold voltage Vt from drifting substantially higher after erase nitride storage memory cells in accordance of the present invention.

FIG. 13 is a flow diagram illustrating the third embodiment of the hole annealing process 1300 with an over-anneal check to alleviate the threshold voltage Vt from drifting substantially higher after erase of nitride storage memory cells. After checking for over-annealing of EV+Y, the process 1300 at step 1310 erases the block to a voltage level equal to or below the EV level. At this juncture, the process 1300 loops back to step 930 to verify once again if the nitride memory block, which has just been erased to equal to or below EV level, is not greater than EV−X level.

The invention has been described with reference to specific exemplary embodiments. For example, although the embodiments in the present invention are directed to nitride storage memory cells, one of skill in the art should recognize that the present invention is also applicable to other types of non-volatile memory arrays and other types of non-volatile memory cells. Various modifications, adaptations, and changes may be made without departing from the spirit and scope of the invention. For example, one of ordinary skill in the art should recognize that Accordingly, the specification and drawings are to be regarded as illustrative of the principles of this invention rather than restrictive, the invention is defined by the following appended claims.

We claim:

1. A method for hole annealing a non-volatile memory array in which each non-volatile memory cell has a non-conducting charge-trapping material placed between a first insulating material and a second insulating material, comprising:

recording as a failed non-volatile memory cell for a non-volatile memory cell in one or more non-volatile memory cells that has a threshold voltage higher than an erase verification level minus a first wordline delta (EV−X);

annealing softly using weak hot electron program in the one or more non-volatile memory bits that have been detected as failed memory bits by injecting electrons to compensate for trapped holes in a first insulating material; and checking for over-annealing of the failed non-volatile memory cells such that the threshold voltage in the non-volatile memory cell is higher than a predetermined over-annealing voltage level.

2. The method of claim 1, prior to the recording step, further comprising verifying each of the one or more non-volatile memory cells in a first block of non-volatile memory array has passed an erased verification threshold minus the first wordline delta (EV−X).

3. The method of claim 2, prior to the verifying step, further comprising erasing one or more non-volatile memory cells in the first block of a non-volatile memory array.

4. The method of claim 3, after the checking step, further comprising erasing again the first block to a threshold voltage equal to or below the erase verification level plus a second wordline delta (EV+Y) if the first block has been determined to have been over-annealed.

5. The method of claim 4, after the step of erasing again the first block, further comprising proceeding to a next block in the non-volatile memory array to verify if each of the non-volatile memory cells in a next block passes the erased verification threshold minus the first wordline delta.

6. The method of claim 4, after the step of erasing again of the first block, further comprising returning the verifying step to check if the one or more non-volatile memory cells in the first block of the non-volatile memory array have passed the erased verification level.

7. The method of claim 4, wherein the predetermined over-annealing voltage level is defined as the threshold voltage in the one or more non-volatile memory cells exceeds the erase verification level plus the second wordline delta.

8. The method of claim 1, wherein the nonconducting charge-trapping material comprises a silicon nitride layer.

9. The method of claim 1, wherein the first insulating layer comprises a first silicon dioxide layer.

10. The method of claim 1, wherein the second insulating layer comprises a second silicon dioxide layer.

11. A method for hole annealing a nitride memory array divided into a plurality of nitride storage memory blocks in which each nitride storage memory cell has a silicon nitride layer disposed between a first silicon dioxide layer and a second silicon dioxide layer, comprising:

erasing the nitride storage memory cells in the plurality of nitride storage memory blocks in the nitride memory array;

verifying each nitride storage memory cell in a first block in the nitride memory storage blocks has passed an erased verification threshold minus a first wordline delta;

recording as a failed non-volatile memory cell for each nitride storage memory cell in the first block that has a threshold voltage higher than an erase verification level minus a first wordline delta;

annealing softly using weak hot electron program to the failed nitride storage memory cells in the first block by injecting electrons to compensate for trapped holes; and checking for over-annealing of the failed nitride storage memory cells such that the threshold voltage of the failed nitride storage memory cells is higher than a predetermined over-annealing voltage level.

12. The A method of claim 11, wherein the predetermined over-annealing voltage level is defined as the threshold voltage in the one or more non-volatile memory cells exceeds the erase verification level plus a second wordline delta.

13. The method of claim 11, further comprising erasing again the first block to a threshold voltage equal to or below the erase verification level plus the second wordline delta if the threshold voltage in the first block exceeds the erase verification level plus the second wordline delta.

14. The method of claim 11, further comprising proceeding to a second block in the nitride memory array to verify if a threshold voltage in the second block has passed an erased verification threshold minus the first wordline delta.

15. The method of claim 11, further comprising returning the verifying step to check if the nitride storage memory cells in the first block of the nitride memory array have passed an erased verification threshold.

\* \* \* \* \*